United States Patent
Yu et al.

(10) Patent No.: US 11,482,465 B2
(45) Date of Patent: Oct. 25, 2022

(54) THERMAL INTERFACE MATERIALS, 3D SEMICONDUCTOR PACKAGES AND METHODS OF MANUFACTURE

(71) Applicant: Taiwan Semiconductor Manufacturing Company, Ltd., Hsinchu (TW)

(72) Inventors: Chen-Hua Yu, Hsinchu (TW); Szu-Wei Lu, Hsinchu (TW); Ying-Ching Shih, Hsinchu (TW); Li-Chung Kuo, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/657,248

(22) Filed: Oct. 18, 2019

(65) Prior Publication Data

US 2021/0118770 A1    Apr. 22, 2021

(51) Int. Cl.
  *H01L 23/373*  (2006.01)
  *H01L 23/498*  (2006.01)
  *H01L 23/532*  (2006.01)
  *H01L 21/56*  (2006.01)

(52) U.S. Cl.
  CPC ...... *H01L 23/3736* (2013.01); *H01L 23/3732* (2013.01); *H01L 23/49816* (2013.01); *H01L 23/53223* (2013.01)

(58) Field of Classification Search
  CPC ............. H01L 23/3736; H01L 23/3732; H01L 23/49816; H01L 23/53223
  See application file for complete search history.

(56) References Cited

U.S. PATENT DOCUMENTS

| | | | | |
|---|---|---|---|---|
| 5,445,308 | A | * | 8/1995 | Nelson ........ C09J 9/02 228/121 |
| 6,975,512 | B1 | * | 12/2005 | Ooi ........ H01L 23/4334 165/185 |
| 8,288,208 | B1 | * | 10/2012 | Liu ........ H01L 21/563 438/118 |
| 9,000,584 | B2 | | 4/2015 | Lin et al. |
| 9,048,222 | B2 | | 6/2015 | Hung et al. |
| 9,048,233 | B2 | | 6/2015 | Wu et al. |
| 9,064,879 | B2 | | 6/2015 | Hung et al. |
| 9,111,949 | B2 | | 8/2015 | Yu et al. |
| 9,263,511 | B2 | | 2/2016 | Yu et al. |

(Continued)

*Primary Examiner* — Christine A Enad
(74) *Attorney, Agent, or Firm* — Slater Matsil, LLP

(57) ABSTRACT

3D semiconductor packages and methods of forming 3D semiconductor package are described herein. The 3D semiconductor packages are formed by mounting a die stack on an interposer, dispensing a thermal interface material (TIM) layer over the die stack and placing a heat spreading element over and attached to the die stack by the TIM layer. The TIM layer provides a reliable adhesion layer and an efficient thermally conductive path between the die stack and interposer to the heat spreading element. As such, delamination of the TIM layer from the heat spreading element is prevented, efficient heat transfer from the die stack to the heat spreading element is provided, and a thermal resistance along thermal paths through the TIM layer between the interposer and heat spreading element are reduced. Thus, the TIM layer reduces overall operating temperatures and increases overall reliability of the 3D semiconductor packages.

20 Claims, 15 Drawing Sheets

(56) References Cited

U.S. PATENT DOCUMENTS

| | | | |
|---|---|---|---|
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,892,204 B2 * | 1/2021 | Kumura | H01L 23/373 |
| 2008/0237842 A1 * | 10/2008 | Manepalli | H01L 21/563 |
| | | | 257/712 |
| 2012/0104591 A1 * | 5/2012 | Warren | H01L 24/97 |
| | | | 257/712 |
| 2015/0102479 A1 * | 4/2015 | Fuergut | H01L 23/3157 |
| | | | 257/706 |
| 2015/0162307 A1 * | 6/2015 | Chen | H01L 21/56 |
| | | | 257/712 |
| 2016/0242283 A1 * | 8/2016 | Hayashi | H05K 3/4673 |
| 2018/0249593 A1 * | 8/2018 | Zhang | H01L 23/3737 |
| 2020/0231800 A1 * | 7/2020 | Roth | C08L 63/00 |
| 2020/0328189 A1 * | 10/2020 | Sung | H01L 23/3737 |

\* cited by examiner

THERMAL INTERFACE MATERIALS, 3D SEMICONDUCTOR PACKAGES AND METHODS OF MANUFACTURE

BACKGROUND

In the packaging of integrated circuits, semiconductor dies may be stacked through bonding, and may be bonded to other package components such as interposers and package substrates. The resulting packages are known as Three-Dimensional (3D) semiconductor packages. Heat dissipation for the stacked semiconductor dies is a challenge in the 3D semiconductor packages.

Efficient dissipation of the heat generated in the stacked dies of the 3D semiconductor packages may be particularly difficult. In a 3D semiconductor package, the heat generated by the stacked dies may have to be dissipated to outer components before the heat can be conducted to a heat dissipation element (e.g., heat spreader). Between the stacked dies and outer components, however, there exist other materials such as underfill, molding compound, and the like, which are not effective in conducting heat. As a result, the heat may be trapped within the 3D semiconductor package causing a sharp local temperature peak or "so-called" hot spots. Furthermore, heat generated by high-power consuming dies may cause problems such as thermal crosstalk for neighboring semiconductor dies, negatively affecting the performance and reliability of the neighboring semiconductor dies. As such, the overall performance and reliability of the 3D semiconductor package itself may be diminished and degraded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
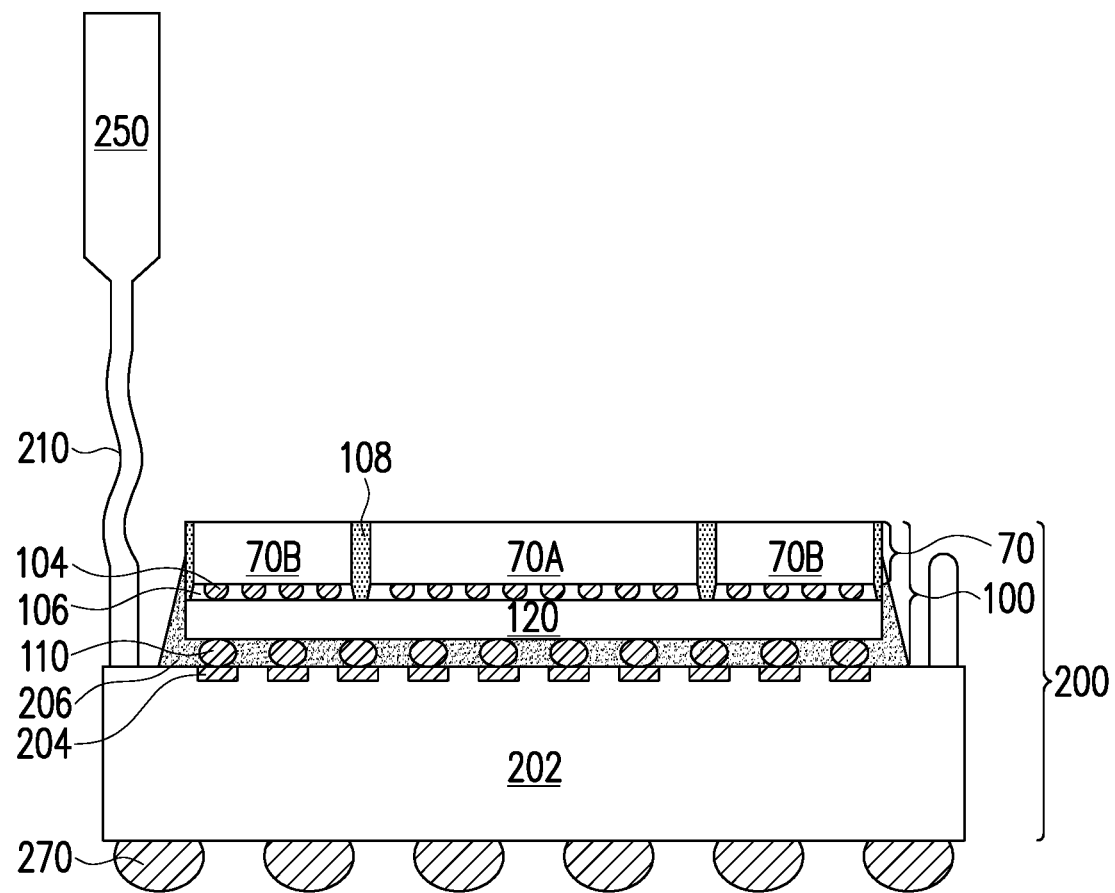
FIG. 1 illustrates an adhesive dispensing process in an intermediate step of forming a 3D semiconductor package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "top," "bottom," "top-side," "bottom-side," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross-sectional view of an intermediate structure during the process of forming a 3D semiconductor package, in accordance with some embodiments. In particular, FIG. 1 illustrates a process of mounting a first device package 100 to a package substrate 202 and a process of dispensing an adhesive 210 during intermediate steps of forming a 3D semiconductor package, in accordance with some embodiments.

According to some embodiments, the first device package 100 is formed by bonding various integrated circuit (IC) die stacks 70 to an interposer 120. In an embodiment, the first device package 100 is a chip-on-wafer (CoW) package, although it should be appreciated that embodiments may be applied to other 3D semiconductor packages.

The die stacks 70, in accordance with some embodiments, may each have a single function (e.g., a logic device, memory die, etc.), or may have multiple functions (e.g., a system-on-chip (SoC)). In a particular embodiment, a first die stack 70A is a processor and the second die stacks 70B are memory modules. The first die stack 70A and the second die stacks 70B may also be referred to herein as the die stacks 70, where references to the die stacks 70 refer to one or more of the first die stack 70A, the second die stacks 70B, or both.

According to some embodiments, the first die stack 70A includes two bonded integrated circuit dies. The first die stack 70A may be a processor such as a central processing unit (CPU), graphics processing unit (GPU), application-specific integrated circuit (ASIC), or the like. In a specific embodiment, the first die stack 70A is a GPU. In some embodiments, a first integrated circuit die and a second integrated circuit die are bonded such that the active surfaces are facing each other ("face-to-face") and may be connected by hybrid bonding, fusion bonding, direct bonding, dielectric bonding, metal bonding, or the like. In some embodiments, the first integrated circuit die is a processor die, and the second integrated circuit die is an interface die. The interface die bridges the processor die to memory dies, and translates commands between the processor and memory dies.

According to some embodiments, the IC dies of the die stacks 70 may comprise active devices and/or passive devices (e.g., transistors, diodes, capacitors, resistors, or the like) and may be in and/or on a front surface of a substrate of the IC dies. In embodiments where the IC dies are logic dies, the logic dies include active devices. In embodiments where the IC dies are interposers, the interposers may include passive devices while active devices may be omitted, such that the interposers are free of active devices. Conductive vias (e.g., through silicon vias (TSVs)) are formed through one or more of the IC dies of the die stacks 70 so that external connections may be made to the die stacks 70.

The conductive vias (not shown) of the first die stack 70A are formed in the second IC die (e.g., the interface die), in accordance with some embodiments. The conductive vias may be formed to extend through the substrate and may extend through interlayer dielectric (ILD) layers of the second IC die such that the conductive vias are physically and electrically connected to a metallization pattern of the second IC die (e.g., the interface die).

According to some embodiments, the second die stacks 70B include multiple integrated circuit dies connected by a conductive via (e.g., TSV). The second die stacks 70B may be memory devices such as dynamic random access memory (DRAM) dies, static random access memory (SRAM) dies, hybrid memory cube (HMC) modules, high bandwidth memory (HBM) modules, or the like. In a specific embodiment, the second die stacks 70B are HBM modules.

Die stacks, such as the die stacks 70, may trap heat, becoming hot spots in subsequently formed device packages. In particular, die stacks including processing devices (such as the first die stack 70A) may have a high power density. For example, in an embodiment where the first die stack 70A is a GPU, the power density of the resulting device packages may be from about 50 W/cm$^2$ to about 300 W/cm$^2$. During operation, heat may be trapped at the interface between the first IC die (e.g., processor die) and the second IC die (e.g., interface die) that are bonded with active surfaces being "face-to-face."

The interposer 120 comprises an interconnect structure for electrically connecting the first die stack 70A and the second die stacks 70B having a front surface (e.g., the surface facing upwards in FIG. 1), and a back surface (e.g., the surface facing downwards in FIG. 1). According to embodiments, the interconnect structure of the interposer 120 is formed on the back surface of a semiconductor substrate. Conductive through-vias (e.g., TSVs) are formed in the semiconductor substrate extending from the interconnect structure to the front surface of the semiconductor substrate. Metal lines and vias of the interconnect structure may be electrically connected to the conductive through-vias. The interposer 120 may (or may not) be free from active devices such as transistors and diodes, and may (or may not) be free from devices such as resistors, inductors, capacitors, and the like.

Although embodiments illustrated herein are discussed in the context of an interposer 120, it should be appreciated that other types of devices may be utilized for the first device package 100. For example, integrated circuit devices such as logic devices may be formed in the semiconductor substrate. In such embodiments, the semiconductor substrate includes active and/or passive devices formed therein. The semiconductor substrate may be silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate, and may be interconnected by interconnect structures formed by, for example, metallization patterns in one or more dielectric layers on the semiconductor substrate to form an integrated circuit.

The die stacks 70 are attached to the interposer 120 with die connectors 104. In an embodiment, the first die stack 70A (e.g., a GPU) and two or more of the second die stacks 70B (e.g., HBM) may be placed on the interposer 120 using, for example, a pick-and-place tool. The die connectors 104 may be formed from a conductive material such as solder, copper, aluminum, gold, nickel, silver, palladium, tin, the like, or a combination thereof. In some embodiments, the die connectors 104 are formed by initially forming a layer of solder through methods such as evaporation, electroplating, printing, solder transfer, ball placement, or the like. Once a layer of solder has been formed on the structure, a reflow may be performed in order to shape the die connectors 104 into desired bump shapes. The die connectors 104 form joints between corresponding connectors on the interposer 120 and the die stacks 70 and electrically connect the interposer 120 to the die stacks 70.

According to some embodiments, an underfill 106 may be placed between the die stacks 70 and the interposer 120, surrounding the die connectors 104 attaching the die stacks 70 to the interposer 120. In some embodiments, the underfill 106 may be placed using a capillary flow process after the die stacks 70 are attached to the interposer 120. In other embodiments, the underfill 106 may be formed by a suitable deposition method before the die stacks 70 are attached to the interposer 120.

Once attached, the die stacks 70 are encapsulated in an encapsulant 108 formed over the various components. The encapsulant 108 may be a molding compound, epoxy, or the like, and may be applied by compression molding, transfer molding, or the like. The encapsulant 108 may be formed over the interposer 120 such that the die stacks 70 are buried or covered by the encapsulant 108. Once formed, the encapsulant 108 is then cured. Once cured, the encapsulant is thinned to expose top surfaces of the die stacks 70. The thinning may be accomplished by a CMP, a grinding process, or the like. After the thinning, top surfaces of the encapsulant 108 and die stacks 70 are coplanar.

Conductive connectors 110 are formed on the back side of the interposer 120. The conductive connectors 110 may be formed before or after the thinning of the encapsulant 108. The back side of the interposer 120 may be thinned before the conductive connectors 110 are formed. The thinning may be accomplished by a chemical-mechanical polish (CMP), a grinding process, or the like. The conductive connectors 110 are electrically connected to features of the interposer 120, and may be ball-grid-array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the conductive connectors 110 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. After the conductive connectors 110 are formed, the first device package 100 may be placed on tape or in a tray awaiting subsequent processing steps.

According to some embodiments, the first device package 100 may be formed as a plurality of device packages and encapsulated in the encapsulant 108 in wafer form. As such, the interposer 120 and the encapsulant 108 of the wafer are singulated by a singulation process, thereby separating the device packages into a plurality of the first device package 100. Singulation is performed along scribe line regions e.g., between adjacent device regions of the plurality of device packages. In some embodiments, the singulation process includes a sawing process, a laser process, an etching process, combinations thereof, or the like. However, any suitable singulation process may be utilized. As such, the resulting device packages after singulation have edges formed by coterminous sidewalls of the interposer 120 and the encapsulant 108. In other words, the outer sidewalls of the first device package 100 comprise the outer sidewalls of the interposer 120 and the outer sidewalls of the encapsulant 108, the outer sidewalls of the interposer 120 having the same width as the outer sidewalls of the encapsulant 108.

The second device package 200, illustrated in FIG. 1, is formed by mounting the first device package 100 to a package substrate 202. In an embodiment, the second device package 200 is a chip-on-wafer-on-substrate (CoWoS) package, although it should be appreciated that other embodiments may be applied to other 3D semiconductor packages.

In some embodiments, the package substrate 202 is a laminate package substrate, wherein conductive traces are embedded in laminate dielectric layers. In other embodiments, the package substrate 202 is a built-up package substrate, which comprises cores (not shown), and conductive traces built on opposite sides of the cores. The cores of built-up package substrates include a fiber layer (not shown) and metallic features (not shown) penetrating through the fiber layer, with the conductive traces interconnected through the metallic features. Specific examples of materials that may be used as the cores include a fiberglass resin such as FR4, bismaleimide-triazine BT resin, other PCB materials or films, build up films such as ABF or other laminates. The conductive traces are interconnected through conductive features in the cores.

In some embodiments, the conductive connectors 110 are reflowed to attach the first device package 100 to front side bond pads 204, thereby bonding the interposer 120 to the package substrate 202. The conductive connectors 110 electrically and/or physically couple the package substrate 202, to the second device package 200.

An underfill 206 may be placed between the first device package 100 and the package substrate 202, surrounding the conductive connectors 110. The underfill 206 may be placed using a capillary flow process after the first device package 100 is attached or may be formed by a suitable deposition method before the first device package 100 is attached.

Once the first device package 100 has been attached to the package substrate 202, an adhesive 210 is applied to designated areas of the package substrate 202 in preparation for attachment of a heat dissipation element 208 (not shown in FIG. 1 but discussed in greater detail below with respect to FIG. 3) to the package substrate 202, e.g., via an adhesive dispensing unit 250 of a die attach machine. The adhesive 210 may be an epoxy, glue, polymeric material, solder paste, thermal adhesive, or the like, and may be a thermally conductive material and/or may contain thermally conductive particles. The adhesive 210 may be applied to any desired areas of the package substrate 202 and may be formed in a pattern (e.g., an adhesive ring) as a perimeter around the first device package 100. The adhesive 210 may be formed to a thickness of between about 5 μm and about 500 μm, such as about 100 μm. However, any suitable adhesive, any suitable method of application, and any suitable thickness may be used for the adhesive 210.

FIG. 1 further illustrates the formation of optional electrical connectors 270 of the second device package 200. In some embodiments, the optional electrical connectors 270 are formed prior to attachment of the heat dissipation element 208. However, the optional electrical connectors 270 may also be formed after the attachment of the heat dissipation element 208 allowing heat generated by the processes used to form the optional electrical connectors 270 to dissipate through the heat dissipation element 208. Once the first device package 100 is mounted to the package substrate 202, the optional electrical connectors 270 are formed over and electrically connected to backside bond pads (not shown) formed in and coplanar with a backside of the package substrate 202 (e.g., the side facing downwards in FIG. 1). The optional electrical connectors 270 are configured to electrically couple the second device package 200 to external systems and to transport signals and/or power to/from the external systems. The optional electrical connectors 270 may include a solder ball, a metal pillar, or another suitable connector and are made of conductive materials, such as tin (Sn), copper (Cu), gold (Au), silver (Ag), alloys thereof, or other suitable materials. In some embodiments, an under bump metallurgy (UBM) layer (not shown) is formed below the optional electrical connectors 270.

In embodiments comprising the optional electrical connectors 270, the package substrate 202 is formed with second metallization layers (not shown), second conductive vias (e.g., TSVs) (not shown), and the backside bond pads (not shown) connecting one or more of the front side bond pads 204 to the optional electrical connectors 270 and/or connecting other active and passive devices formed within or on the package substrate 202 to the optional electrical connectors 270. The second metallization layers and second vias may be formed in connection with one or more of the active and passive devices of the package substrate 202 and are designed to connect the various devices to form functional circuitry accessible via the backside bond pads. The second metallization layers, the second vias, and the backside bond pads may be formed using any materials (e.g., copper) and any processes (e.g., deposition, damascene, dual damascene, or the like) suitable for forming the first metallization layers, first vias, and front side bond pads 204, as set forth above.

Figure 2A:
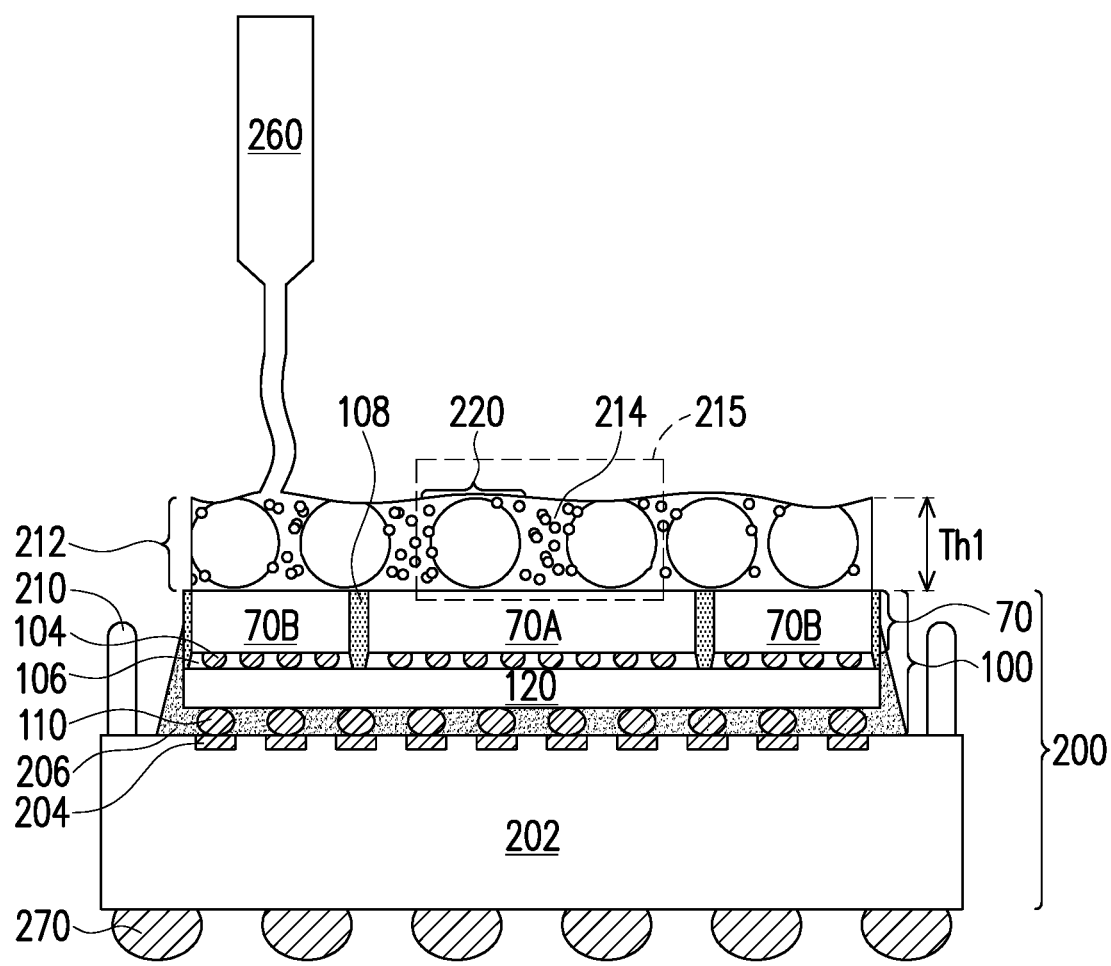
FIG. 2A illustrates a dispensing process of a thermal interface material (TIM) in an intermediate step of forming the 3D semiconductor package, in accordance with some embodiments.

FIG. 2A illustrates a deposition process of a thermal interface material (TIM) layer (e.g., TIM layer 212) in an intermediate step of forming the 3D semiconductor package, in accordance with some embodiments. The TIM layer 212 may be applied to a top surface of the first device package 100 in order to provide a thermal interface between the first device package 100 and a subsequently placed overlying heat dissipation element 208 (not shown here; however, the heat spreader is discussed in detail with respect to FIG. 3). The TIM layer 212 comprises a core material 214 (e.g., an epoxy resin) and a thermally conductive filler 220 comprising particles of different sizes. In some embodiments, the TIM layer 212 may be applied in either a solid, grease, or gel consistency and may be dispensed, for example, via a TIM dispensing unit 260 (e.g., syringe, jetting pump tool, volumetric pump tool, auger pump tool, printer, or the like). In other embodiments, the TIM layer 212 may be applied as an adhesive film type TIM (not shown), such as a carbon nanotube or a graphite based TIM adhesive film via a suitable film die attach process.

FIG. 2A further illustrates, according to some embodiments, the TIM layer 212 is formed to a first thickness Th1 sufficiently large enough to encapsulate the largest particles of the thermally conductive filler 220. According to some embodiments, the TIM layer 212 is formed to a first thickness Th1 of between about 5 µm and about 1000 µm, such as about 300 µm. However any suitable thickness may be used.

FIG. 2A further illustrates the thermally conductive filler 220 comprises particles having two different sizes (also referred to herein as a binary size filler and/or a binary filler system), according to some embodiments. However, the thermally conductive filler 220 may have particles having any suitable number of different sizes. Although the particles of the thermally conductive filler 220 are illustrated in FIG. 2A as being spherical in shape, it is understood that the particles of the thermally conductive filler 220 may also be any other suitable shape (e.g., spheroidal, cuboidal, prismoidal, polyhedral, non-polyhedral, or the like) and may be regular shaped or irregular shaped. As such, the size of the particles of the thermally conductive filler 220 may be considered as a largest linear dimension of the particle, such as a diameter, a length, a main axis, or the like. However, any other suitable dimension may also be used to determine sizes of the particles of the thermally conductive filler 220. Moreover, the size of the particles of the thermally conductive filler 220 may be determined as an average size of the particles within a certain range or tolerance.

FIG. 2A further illustrates an area 215 of the TIM layer 212 comprising the thermally conductive filler 220 in a region over the first die stack 70A of the first device package 100. The thermally conductive filler 220 of the TIM layer 212 is now discussed in greater detail with reference to the area 215 and to the following figures.

Figure 2B:
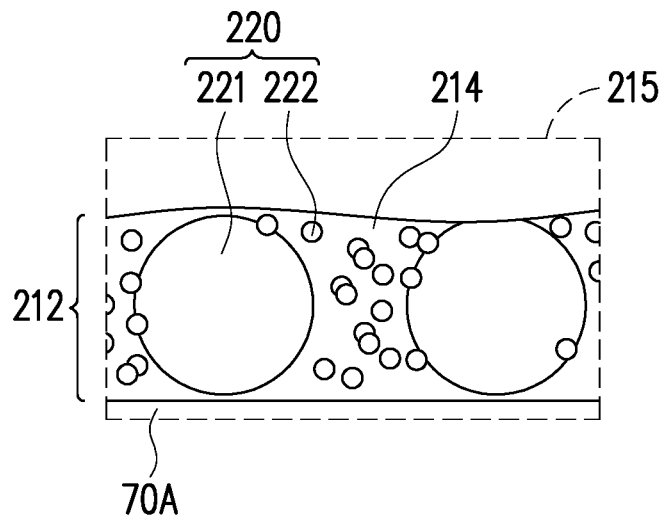
FIGS. 2B, 2C and 2D illustrate two thermal interface materials (TIMs), in accordance with some embodiments.

FIG. 2B illustrates an enlarged view of the area 215 of FIG. 2A. In accordance with some embodiments, the thermally conductive filler 220 is a binary filler system and comprises particles (e.g., first particles 221 and second particles 222) having two different sizes. The first particles 221 may also be referred to herein as primary fill particles and the second particles 222 may also be referred to herein as secondary fill particles. In some embodiments, the first particles 221 of the conductive filler 220 are mixed with the core material 214 (e.g., epoxy resin) and dispensed with the core material 214 via the TIM dispensing unit 260. In other embodiments, the first particles 221 are arranged within an adhesive film type TIM at desired locations such that, once the adhesive film type TIM is attached to the top surface of the first device package 100, the first particles 221 are arranged in the desired locations over the die stacks 70.

According to some embodiments, the first particles 221 of the thermally conductive filler 220 are formed to have a first material composition comprising one or more materials such as silver (Ag), zinc oxide (ZnO), aluminum (Al), silicon oxide ($SiO_2$), carbon black (C), graphite (C), diamond (C), other allotropes of carbon (C), combinations thereof, and the like. However, any suitable material may be used for the first particles 221. The first particles 221 are formed to have a first shape (e.g., spherical) and are formed to a first size S1 (see FIG. 2C) of between about 5 µm and about 500 µm, such as about 50 µm, in accordance with some embodiments. However, any suitable shape and any suitable size may be used for the first particles 221. Furthermore, the material of the first particles 221 are chosen to have a first thermal conductivity (k) that is greater than or equal to 1 W/mk. The first thermal conductivity (k) of the first particles 221 is between about 1 W/mk and about 5000 W/mk, such as about 30 W/mk, in accordance with some embodiments. However, any suitable thermal conductivity (k) may be utilized for the first thermal conductivity.

FIG. 2B further illustrates the thermally conductive filler 220 comprising second particles 222 being of a smaller size than the first particles 221. According to some embodiments, the second particles 222 may be mixed with the core material 214 and dispensed via the TIM dispensing unit 260. In other embodiments, the first particles 221 and the second particles 222 are arranged within a core material 214 of an adhesive film type TIM (not shown) such that, once the adhesive film type TIM is attached to the top surface of the first device package 100, the first particles 221 and the second particles 222 are arranged within the core material 214 over the die stacks 70 with the second particles 222 being arranged in between the first particles 221.

According to some embodiments, the second particles 222 of the thermally conductive filler 220 are formed to have a second material composition comprising any of the one or more materials suitable for forming the first particles 221. In some embodiments, the second material composition of the second particles 222 is the same as the first material composition of the first particles 221. For example, in a particular embodiment, the second particles 222 comprise the same material (e.g., silver (Ag)) as the first particles 221. In other embodiments, the second material composition is different from the first material composition. However, any suitable material may be used for the second particles 222. For example, in another embodiment, the second particles 222 comprise silver (Ag) and the first particles 221 comprise aluminum (Al).

According to some embodiments, the second particles 222 are formed to have a second shape and are formed to a second size S2 (see FIG. 2C) of between about 0.1 µm and about 30 µm, such as about 5 µm. However any suitable sizes may be used for the first size S1 and second size S2 of the binary filler system of the thermally conductive filler 220. The second shape of the second particles 222 may be any of the shapes suitable for the first particles 221, as set forth above. According to some embodiments, the second shape of the second particles 222 is the same shape (e.g., spherical) as the first shape of the first particles 221; although, the second shape may be different from the first shape in other embodiments. Furthermore, the materials for the second particles 222 are chosen to have a second thermal conductivity (k) that is greater than or equal to 1 W/mk. The second thermal conductivity (k) of the second particles 222 is between about 1 W/mk and about 5000 W/mk, such as about 30 W/mk, in accordance with some embodiments. However, any suitable thermal conductivity (k) may be utilized.

Figure 2C:
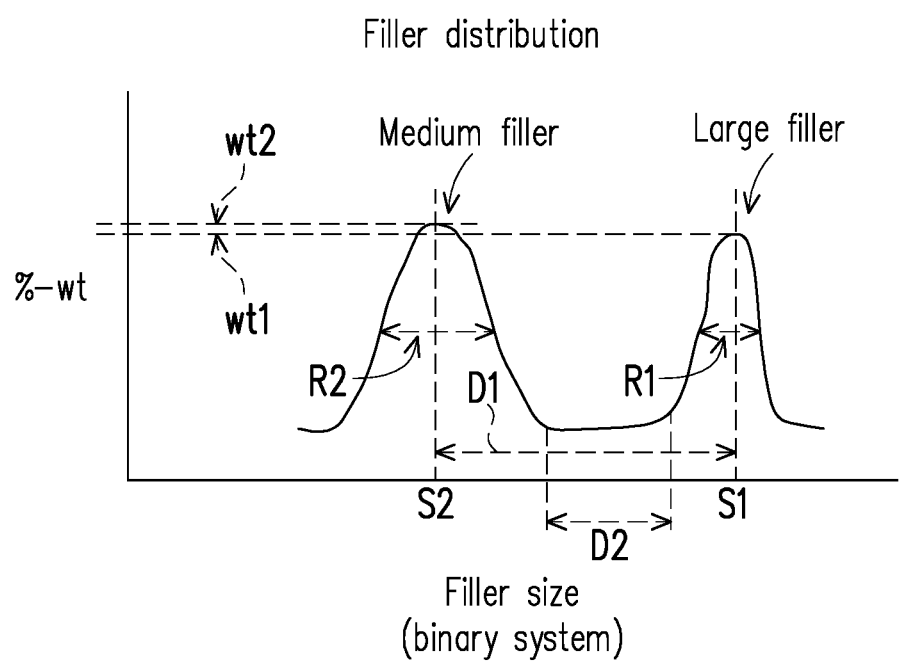
Figure 2D:
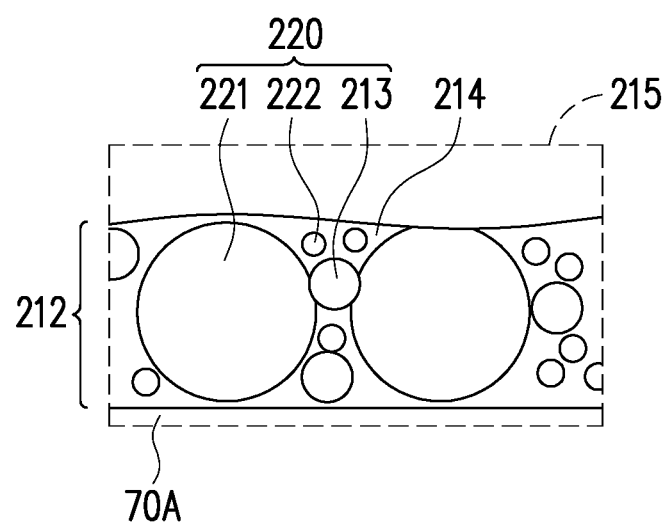

FIG. 2C illustrates a filler distribution of particle sizes based on a percentage weight (wt) of the binary filler system of the thermally conductive filler 220 of the TIM layer 212 of FIG. 2B, in accordance with some embodiments. In FIG. 2D, the first particles 221 (e.g., large filler particles) are shown having a first size S1 and a first percentage by weight (wt1) and the second particles 222 (e.g., small filler particles) are shown having a second size S2 and a second percentage by weight (wt2). According to some embodiments, the first particles 221 have a first size S1 within a first range R1 of between about 5 µm and about 500 µm, such as about 50 µm and have a first percentage by weight (wt1) of between about 1% by weight and about 95% by weight, such as about 50% by weight and the second particles 222 have a second size S2 within a second range R2 of between about 0.1 µm and about 30 µm, such as about 5 µm and have a second percentage by weight (wt2) of between about 1% by weight and about 95% by weight, such as about 50% by weight. However, any suitable ranges, any suitable sizes, and any suitable percentages may be used.

FIG. 2C further illustrates a first size difference D1 between the first size S1 of the large filler particles and the second size S2 of the small filler particles. According to some embodiments, the first size difference D1 is between about 3 µm and about 100 µm, such as about 50 µm. The first size difference D1 may also be expressed in terms of a first size ratio of the second size S2 to the first size S1. According to some embodiments, the first size ratio (S2/S1) of the binary filler system of the thermally conductive filler 220 is between about 0.1% and about 70%, such as about 50%. In other embodiments, the first size S1 may be more than two times the second size S2.

Additionally, the first range R1 may be separated from and independent of the second range R2, such that the first range R1 is located completely outside of the second range R2 and the second range R2 is located completely outside of the first range R1. By not overlapping, there is a clear separation of sizes between the first range R1 of sizes and the second range R2 of sizes, such that, while there may be size differentiations within each of the first range R1 and the second range R2, there is also a clear separation of sizes between the first range R1 and the second range R2. In an embodiment the separation size difference D2 may be in a range between about 1 µm and about 500 µm, such as about 20 µm. However, any suitable separation size difference may be utilized.

FIG. 2D illustrates the enlarged view of the area 215 of FIG. 2A in another embodiment which utilizes a system of tertiary fill particles. In accordance with some embodiments, the thermally conductive filler 220 comprises third particles 223 having a third size different than the sizes of the first particles 221 and the second particles 222. The third particles 223 may also be referred to herein as tertiary fill particles. The thermally conductive filler 220, having particles of three different sizes may also be referred to herein as a ternary size filler and/or a ternary filler system.

According to some embodiments, the third particles 223 may be mixed with the core material 214 and dispensed via the TIM dispensing unit 260. In other embodiments, the third particles 223 are arranged within the adhesive film type TIM (not shown) along with the first particles 221 and the second particles 222 such that, once the adhesive film type TIM is attached to the top surface of the first device package 100, the third particles 223 are arranged within the core material 214 over the die stacks 70 along with the first particles 221 and the second particles 222 and the third particles 223 are arranged in between the first particles 221 and among the second particles 222.

According to some embodiments, the third particles 223 of the thermally conductive filler 220 are formed to have a third material composition comprising any of the one or more materials suitable for forming the first particles 221. In some embodiments, the third material composition of the third particles 223 is the same as one or more of the first material composition of the first particles 221 and the second material composition of the second particles 222. For example, in a particular embodiment, the third particles 223 comprise the same material (e.g., silver (Ag)) as the first particles 221 and the second particles 222. In other embodiments, the third material composition is different from one or more of the first material composition and the second material composition. However, any suitable material may be used for the third particles 223. For example, in another embodiment, the third particles 223 comprise zinc oxide (ZnO), the second particles 222 comprise silver (Ag), and the first particles 221 comprise aluminum (Al).

According to some embodiments, the third particles 223 are formed to have a third shape and are formed to a third size of between about 5 µm and about 500 µm, such as about 50 µm. However, any suitable sizes may be used for the first size, second size, and third size of the ternary filler system of the thermally conductive filler 220. The third shape of the third particles 223 may be any of the shapes suitable for the first particles 221, as set forth above. According to some embodiments, the third shape of the third particles 223 is the same shape (e.g., spherical) as one or more of the first shape of the first particles 221 and the second shape of the second particles 222; although, the third shape may be different from one or more of the first shape and the second shape in other embodiments. Furthermore, the material of the third particles 223 is chosen to have a third thermal conductivity (k) that is greater than or equal to 1 W/mk. The third thermal conductivity (k) of the third particles 223 is between about 1 W/mk and about 5000 W/mk, such as about 30 W/mk, in accordance with some embodiments. However, any suitable thermal conductivity (k) may be utilized.

Although embodiments illustrated in FIGS. 2B-2D are directed towards binary filler systems and ternary filler systems of thermally conductive fillers, it is understood that the thermally conductive filler 220 may comprise particles having any suitable number of different sizes. Furthermore, any suitable number of different materials, any suitable thermal conductivity (k), and any suitable number of different shapes may be utilized for the compositions, thermal conductivities, and shapes of the different size particles of the thermally conductive filler 220.

Figure 3:
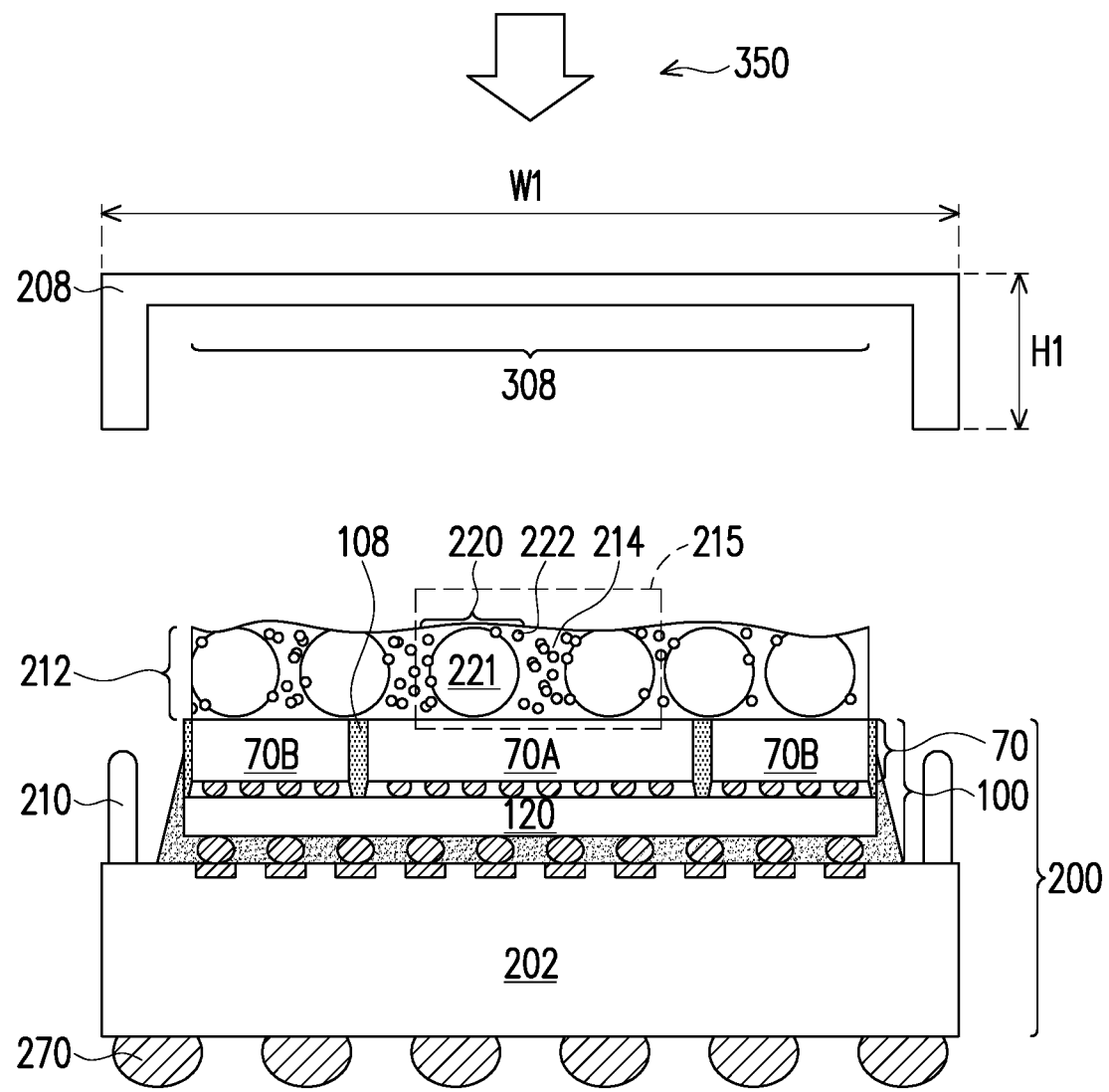
FIG. 3 illustrates a placement of a thermally conductive lid in an intermediate step of forming the 3D semiconductor package, in accordance with some embodiments.

Turning to FIG. 3, this figure illustrates a placement process 350 of a heat dissipation element 208 in an intermediate step of forming the 3D semiconductor package, in accordance with some embodiments. Once the adhesive 210 has been applied to the package substrate 202 and the TIM layer 212 has been deposited, attached, or otherwise formed over the first device package 100, the heat dissipation element 208 may be attached to the second device package 200. The heat dissipation element 208 may be formed from a material with high thermal conductivity, such as steel, stainless steel, copper, the like, or combinations thereof and may be formed with an optional coating of another metal, such as gold, nickel, or the like. In some embodiments, the heat dissipation element 208 is a single contiguous material. In some embodiments, the heat dissipation element 208 includes multiple pieces that may be the same or different materials. In some embodiments, the heat dissipation element 208 may be a heat dissipation device (e.g., heat sink, heat spreader, vapor chamber lid, or the like) and may be placed over the second device package 200 by a placement process 350 (e.g., by a pick and place tool). However, the heat dissipation element 208 may be placed using any other suitable methods.

According to embodiments, during the placement process 350, the heat dissipation element 208 is pressed into the adhesive 210 applied to the package substrate 202 and a central region 308 of the heat dissipation element 208 is pressed into the TIM layer 212. As such, the adhesive 210 and the TIM layer 212 physically attach and thermally couple the first device package 100 and the package substrate 202 to the heat dissipation element 208.

Furthermore, the first particles 221 of the thermally conductive filler 220 serve as spacers and as thermal conductors between the planar top surface of the first device package 100 and the heat dissipation element 208. According to embodiments, the first particles 221 are substantially uniform in height and are of a size that fills the gap between the top surface of the first device package 100 and the central region 308 of the heat dissipation element 208 and physically contacts both the top surface of the first device package 100 and the central region 308 of the heat dissipation element 208, once the heat dissipation element 208 is placed. As such, the first particles 221 prevent the heat dissipation element 208 from being placed askew during the placement process 350 and provides for highly uniform bond-line thickness (BLT) control for the interface between the TIM layer 212 and the central region of the heat dissipation element 208.

Figure 4:
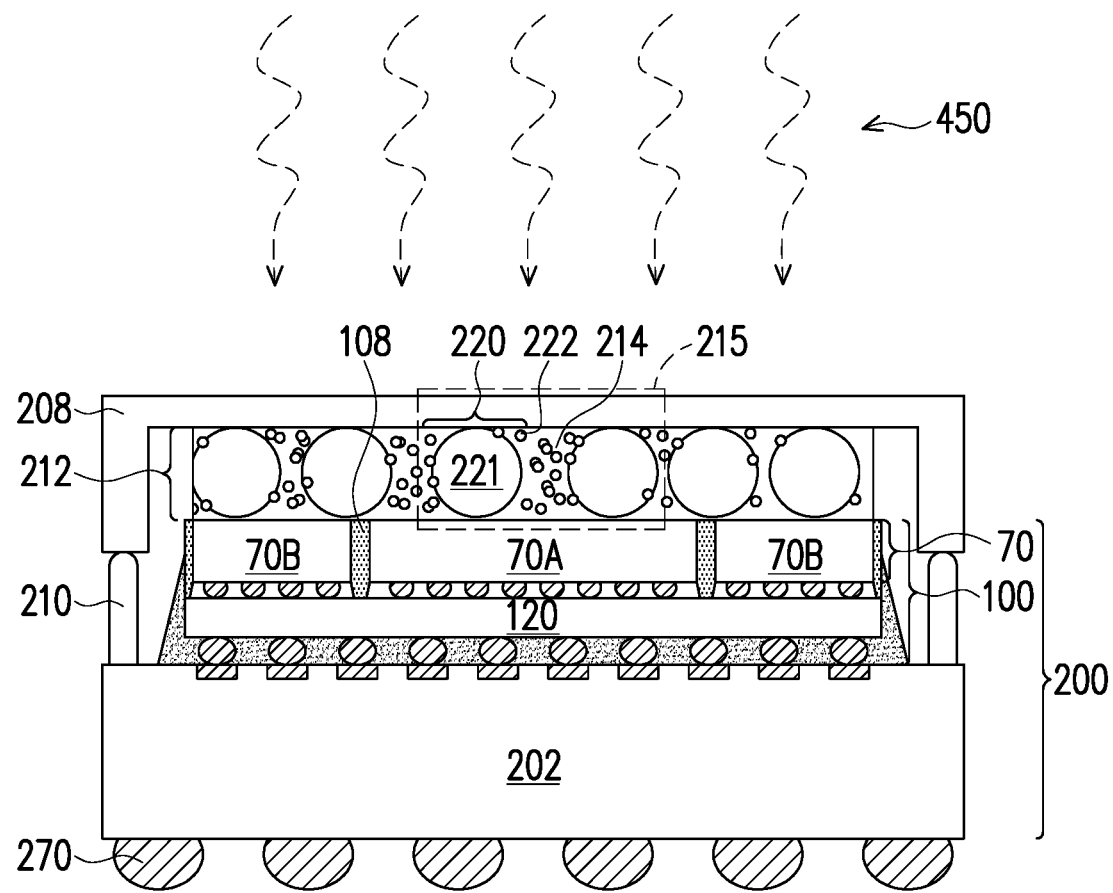
FIG. 4 illustrates a curing process in an intermediate step of forming the 3D semiconductor package, in accordance with some embodiments.

FIG. 4 illustrates a curing process 450 in an intermediate step of forming the 3D semiconductor package, in accordance with some embodiments. According to some embodiments, once the heat dissipation element 208 has been placed, the TIM layer 212 and/or the adhesive 210 are then cured and solidified, for example, in the curing process 450 (e.g., thermal curing). According to some embodiments, the curing process 450 may be performed at a process temperature of between about 10° C. and about 250° C., such as about 150° C. for a period of time of between about 1 min and about 1440 min, such as about 120 min. Once cured, the first device package 100 and the package substrate 202 are physically attached and thermally coupled by the adhesive 210 and by the TIM layer 212 to the heat dissipation element 208.

Figure 5A:
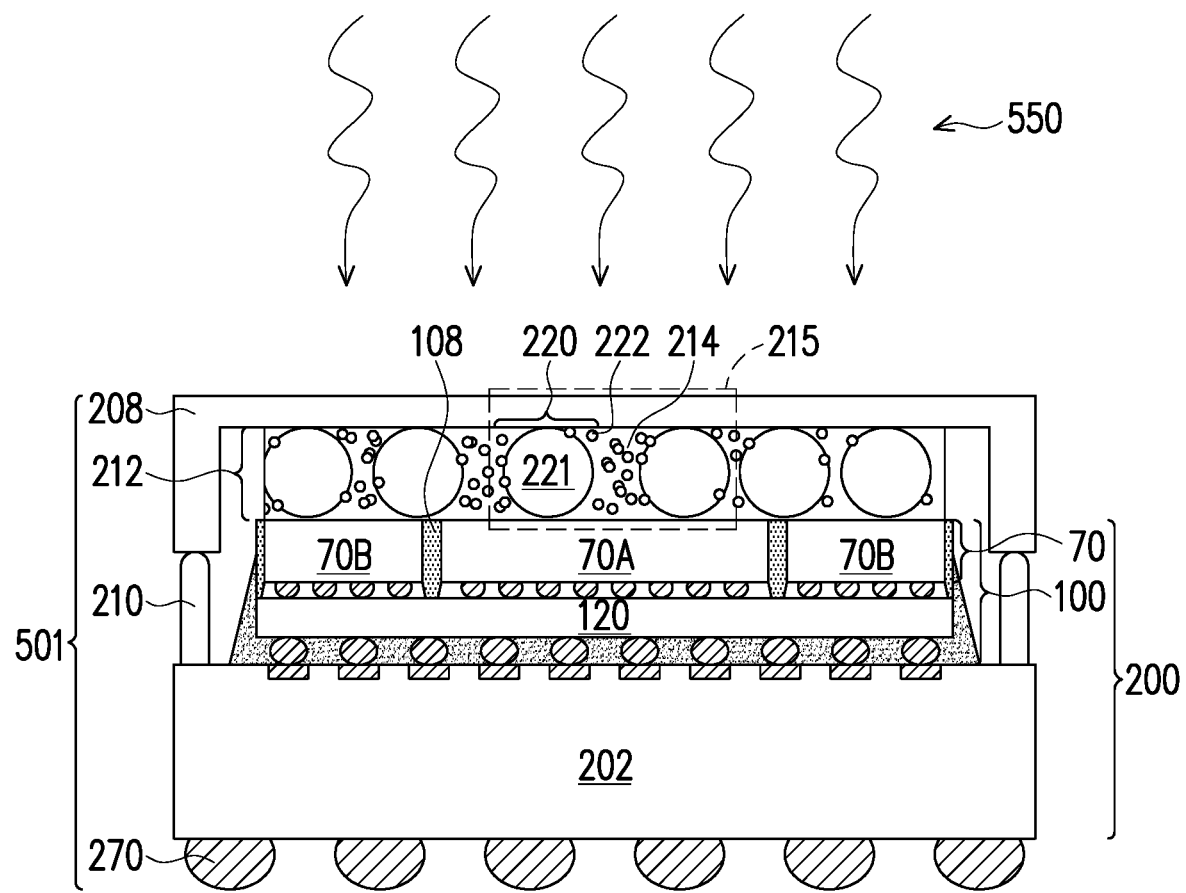
FIGS. 5A-5B illustrate, according to some embodiments, a rapid annealing process in an intermediate step of forming the 3D semiconductor package comprising a first device package, in accordance with some embodiments.

Turing to FIG. 5A, this figure illustrates an anneal process 550 for the TIM layer 212, in an intermediate step of forming a first 3D semiconductor package 501, in accordance with some embodiments. According to some embodiments, the anneal process 550 may be a thermal anneal process (e.g., rapid anneal) performed at a process temperature of between about 20° C. and about 250° C., such as about 150° C. and performed for a period of time between about 0.1 min and about 240 min, such as about 1 min. The anneal process 550 may strengthen the bonds between the materials of the first particles 221 of the TIM layer 212, the materials of the second particles 222 of the TIM layer 212 and the materials of the heat dissipation element 208 and the materials of the planar surfaces of the first device package 100 (e.g., the backside of the first die stack 70A, the backsides of the second die stacks 70B, and the encapsulant 108). Furthermore, due to the superior bonding and adhesion provided by the second particles 222 filling the gaps and decreasing the occupancy rate of the core material 214 and due to the uniformity and stability of the bond-line thickness (BLT) provided by the first particles 221, delamination of the TIM layer 212 from the heat dissipation element 208 and deformation of the bond-line thickness (BLT) during the anneal process 550 is greatly reduced or altogether prevented.

In accordance with embodiments, the first 3D semiconductor package 501 and method of forming a first 3D semiconductor package 501 are described herein. The first 3D semiconductor package 501 is formed by mounting a first device package 100 on a package substrate 202, forming a thermal interface material (TIM) layer (e.g., TIM layer 212) comprising a core material 214 (e.g., epoxy resin) and a thermally conductive filler 220 over the first device package 100. Then, placing the heat dissipation element 208 over the first device package 100, the heat dissipation element 208 being attached to the first device package 100 by the TIM layer 212 and being attached to the package substrate 202 by the adhesive 210. The thermally conductive filler 220 comprises a fill particulate including a plurality of fill particle sizes (e.g., a binary filler system). The first particles 221 (e.g., the relatively large sized particles) of the TIM layer 212 provide highly efficient thermal conduction between the first device package 100 and the heat dissipation element 208 as compared to the relatively thermally resistant material of the core material 214. Furthermore, the first particles 221 serve as spacers to provide superior bond-line thickness and uniformity between the heat dissipation element 208 and the first device package 100. The second particles 222 (e.g., the relatively small sized particles) of the TIM layer 212 are also highly efficient thermal conductors and serve to fill voids within the core material 214 (e.g., resin) of the TIM layer 212 in between the relatively large sized fill particles. As such, the second particles 222 (e.g., the relatively small sized particles) provide highly efficient thermal conductivity even along the secondary heat transfer paths 422 through the relatively resistant thermal conductivity of the core material 214 between the first particles 221. The secondary heat transfer paths 422 allow for further thermal coupling and, thus, even more thermal coupling efficiency, between the first device package 100 and the heat dissipation element 208 as compared to the relatively resistant thermal conductivity of the core material 214 alone. As such, delamination of the TIM layer 212 from the heat dissipation element 208 during the anneal process 550 is minimized or altogether prevented. Furthermore, highly efficient heat transfer from the first device package 100 and from the package substrate 202 to the heat dissipation element 208 is provided, and a reduction in thermal resistance along the primary heat transfer paths 421 is provided by the first particles 221 and the secondary heat transfer paths 422 provided by the second particles 222 through the core material 214. Thus, the TIM layer 212 reduces operating temperatures and increases reliability of the resulting first 3D semiconductor package 501.

Although embodiments have been described with respect to the first 3D semiconductor package 501 comprising a chip-on-wafer (CoW) package as the first device package 100, it is understood that other embodiments of 3D semiconductor packages comprising other package technologies as the first device package 100 may also be formed using the methods disclosed herein without departing from the spirit of the embodiments disclosed. As such, the following embodiments of 3D semiconductor packages incorporating other package technologies for the first device package 100 will now be described.

Figure 5B:
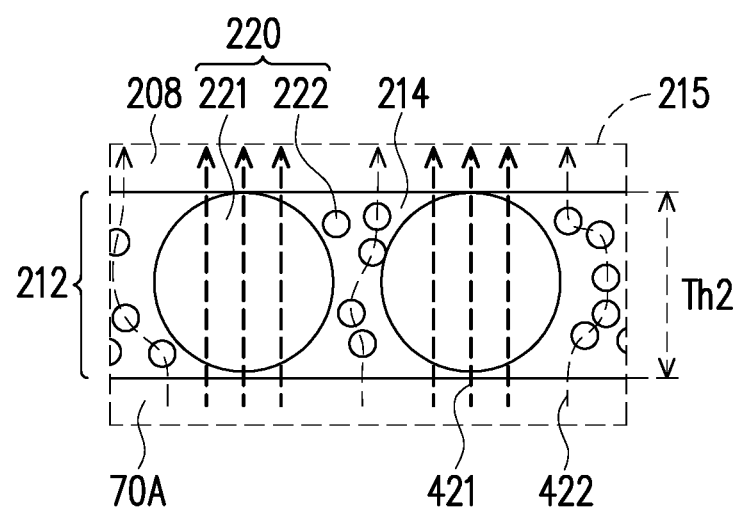

FIG. 5B illustrates an enlarged view of the area 215 of FIG. 5A during operation. In accordance with some embodiments, the first particles 221 are in physical contact with the planar top surface of the first device package 100 and are also in physical contact with the heat dissipation element 208. As such, the first particles 221 provide highly efficient heat transfer for the primary heat transfer paths 421 from the first device package 100 to the heat dissipation element 208. Additionally, the core material 214 (e.g., epoxy resin) provides a first thermal conductivity (k1) of between about 0.1 W/mk and about 10 W/mk, such as about 0.3 W/mk and the first particles 221 provide a second thermal conductivity (k2) of between about 1 W/mk and about 5000 W/mk, such as about 30 W/mk. As such, the first particles 221 provide an increased overall thermal transfer along the primary heat transfer paths 421 by a factor of between about 3 times more and about 1000 times more, such as about 10 times more thermal transfer as compared to thermal transfer of the core material 214 (e.g., epoxy resin) of the TIM layer 212 alone.

FIG. 5B further illustrates, in accordance with some embodiments, the second particles 222 being arranged within the core material 214 of the TIM layer 212 and filling voids and filling gaps in between the first particles 221. As such, the second particles 222 provide increased contact at a first interface between the TIM layer 212 and the first device package 100 and provide increased contact at a second interface between the TIM layer 212 and the heat dissipation element 208. Thus, more efficient heat transfer is provided along secondary heat transfer paths 422 from first locations along the planar surface of the first device package 100 to second locations along the heat dissipation element 208 and in between the first particles 221. Furthermore, by filling the gaps between the first particles 221, the second particles 222 decrease the occupancy rate of the core material 214 (e.g., resin) and provide for superior bonding and adhesion between of the TIM layer 212 to the surfaces of the heat dissipation element 208 and the first device package 100. According to some embodiments, the second particles 222 fill the gaps between the first particles 221 and decrease the occupancy rate of the core material 214 by a percentage by volume of between about 1% and about 90%, such as about 20%. As such, the occupancy rate by volume of the core material 214 disposed within the gaps between the first particles 221 is less than about 1% to less than about 90%, such as less than about 50%.

As further illustrated in FIG. 5B, once the TIM layer 212 is sandwiched between the first device package 100 and the heat dissipation element 208, the first particles 221 and the second particles 222 provide a highly uniform BLT at the interface between the TIM layer 212 and the heat dissipation element 208 and at the interface between the TIM layer 212 and the planar top surface of the first device package 100. According to some embodiments, once sandwiched there between, the TIM layer 212 separates the top surface of the first device package 100 and the heat dissipation element 208 by a bond-line thickness (BLT) Th2 of between about 5 µm and about 500 µm, such as about 50 µm with a uniformity of the BLT thickness Th2 being between about ±1 µm and about ±200 µm, such as about ±20 µm. However, any suitable thickness and any suitable uniformity of thickness may be used for the BLT thickness Th2.

Figure 6:
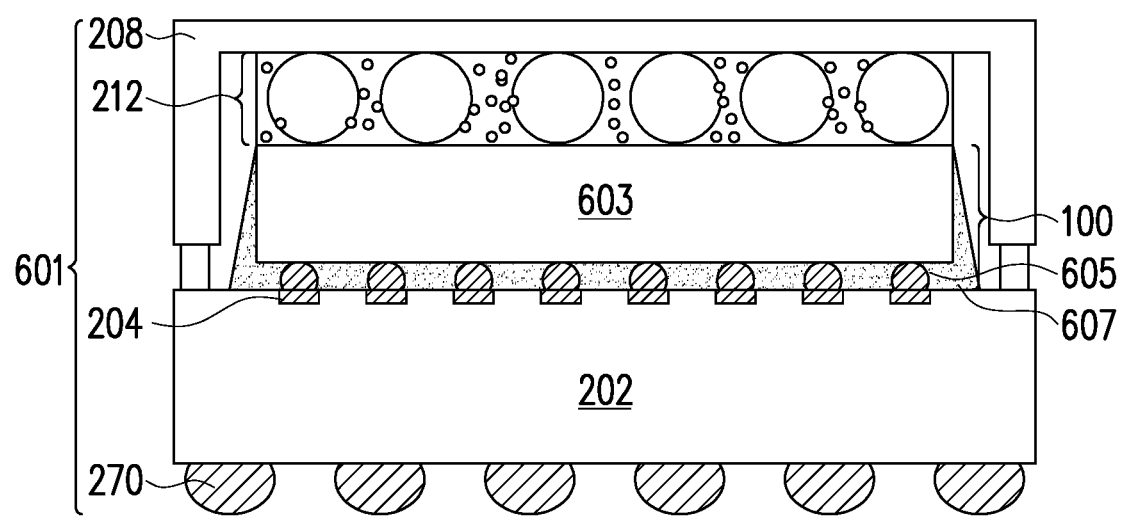
FIGS. 6-12 illustrate the 3D semiconductor package comprising the first device package, in accordance with some embodiments.

FIG. 6 illustrates a second 3D semiconductor package 601, in accordance with another embodiment of the 3D semiconductor package. The second 3D semiconductor package 601 comprises a Flip-Chip Ball-Grid-Array (FC-BGA) package as the first device package 100 instead of the chip-on-wafer (CoW) package of the first 3D semiconductor package 501 of FIG. 5A. According to embodiments, the FC-BGA of the first device package 100 comprises a flip chip die 603 with bumps of a BGA 605 formed as external contacts of the flip chip die 603 and the flip chip die 603 being face-down and attached via the BGA 605 to the front side bond pads 204 of the package substrate 202. According to some embodiments, the second 3D semiconductor package 601 comprises an underfill 607 filling the open spaces between the flip chip die 603 and the package substrate 202. The flip chip die 603, the BGA 605 and the underfill 607 may be formed via any suitable materials and any suitable methods for forming a FC-BGA package. The second 3D semiconductor package 601 further comprises the TIM layer 212 and the heat dissipation element 208 placed over and attached to the flip chip die 603 via the TIM layer 212. The TIM layer 212 both physically and thermally couples the FC-BGA package to the heat dissipation element 208. Furthermore, the second 3D semiconductor package 601 may be assembled using any suitable methods set forth above for assembling the first 3D semiconductor package 501.

Figure 7:
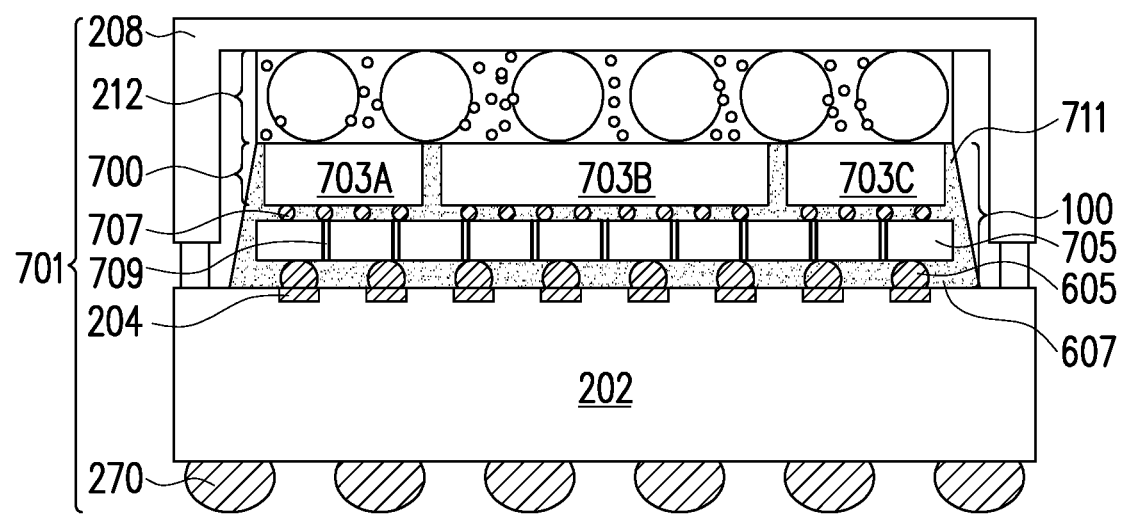

FIG. 7 illustrates a third 3D semiconductor package 701, in accordance with still another embodiment of the 3D semiconductor package. The third 3D semiconductor package 701 comprises a Chip-on-Wafer-on-Substrate (CoWoS) package as the first device package 100 instead of the chip-on-wafer (CoW) package of the first 3D semiconductor package 501 of FIG. 5A. According to some embodiments, the CoWoS package comprises chiplets 700 (e.g., first chiplet 703A, second chiplet 703B, and third chiplet 703C) attached side-by-side to a silicon interposer 705 in order to achieve better interconnect density and performance. External contacts (not shown) of the chiplets 700 are bonded through micro bumps 707 to external contacts (not shown) of a top-side of the silicon interposer 705. The chiplets 700 and the silicon interposer 705 may be embedded in a molding compound 711 with through substrate vias (TSVs) 709 of the silicon interposer 705 electrically coupling the chiplets 700 to the BGA 605 formed at a bottom-side of the silicon interposer 705 as external contacts of the first device package 100 (e.g., Chip-on-Wafer-on-Substrate (CoWoS) package). The first device package 100 is bonded via the BGA 605 to the front side bond pads 204 of the package substrate 202. The chiplets 700, the molding compound 711, the BGA 605 and the underfill 607 may be formed via any suitable materials and any suitable methods for forming a CoWoS package. The third 3D semiconductor package 701 further comprises the TIM layer 212 and the heat dissipation element 208 placed over and attached to the chiplets 700 and the molding compound 711 via the TIM layer 212. The TIM layer 212 both physically and thermally couples the CoWoS package to the heat dissipation element 208. Furthermore, the third 3D semiconductor package 701 may be assembled using any suitable methods set forth above for assembling the first 3D semiconductor package 501.

Figure 8:
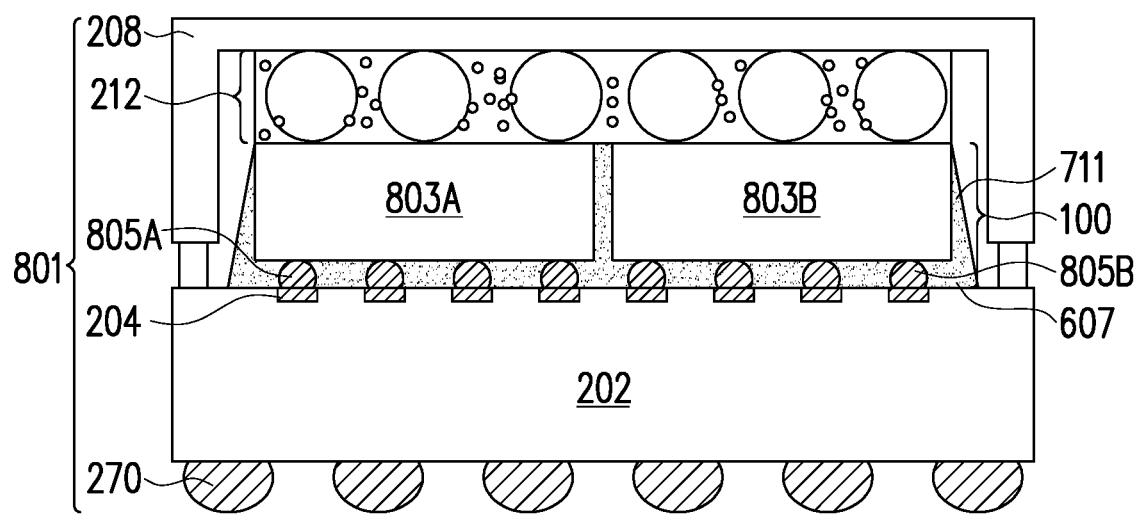

FIG. 8 illustrates a fourth 3D semiconductor package 801, in accordance with yet another embodiment of the 3D semiconductor package. The fourth 3D semiconductor package 801 comprises a multi-chip module (MCM) as the first device package 100 instead of the chip-on-wafer (CoW) package of the first 3D semiconductor package 501 of FIG. 5A. According to embodiments, the MCM of the first device package 100 comprises a plurality of integrated chip packages (e.g., a first IC package 803A and a second IC package 803B) embedded in a molding compound 711. The first IC package 803A comprises bumps of a first BGA 805A formed as external contacts of the first IC package 803A and the second IC package 803B comprises bumps of a second BGA 805B formed as external contacts of the second IC package 803B. The bumps of the first BGA 805A and the second BGA 805B bond the first IC package 803A and the second IC package 803B to the front side bond pads 204 of the package substrate 202. According to some embodiments, the fourth 3D semiconductor package 801 comprises an underfill 607 filling the open spaces between the first IC package 803A and the second IC package 803B and the package substrate 202. The first IC package 803A, the second IC package 803B, the molding compound 711, the first BGA 805A, the second BGA 805B, and the underfill 607 may be formed via any suitable materials and any suitable methods for forming a MCM package. The fourth 3D semiconductor package 801 further comprises the TIM layer 212 and the heat dissipation element 208 placed over and attached to the first IC package 803A, the second IC package 803B, and the molding compound 711 via the TIM layer 212. The TIM layer 212 both physically and thermally couples the MCM package to the heat dissipation element 208. Furthermore, the fourth 3D semiconductor package 801 may be assembled using any suitable methods set forth above for assembling the first 3D semiconductor package 501.

Figure 9:
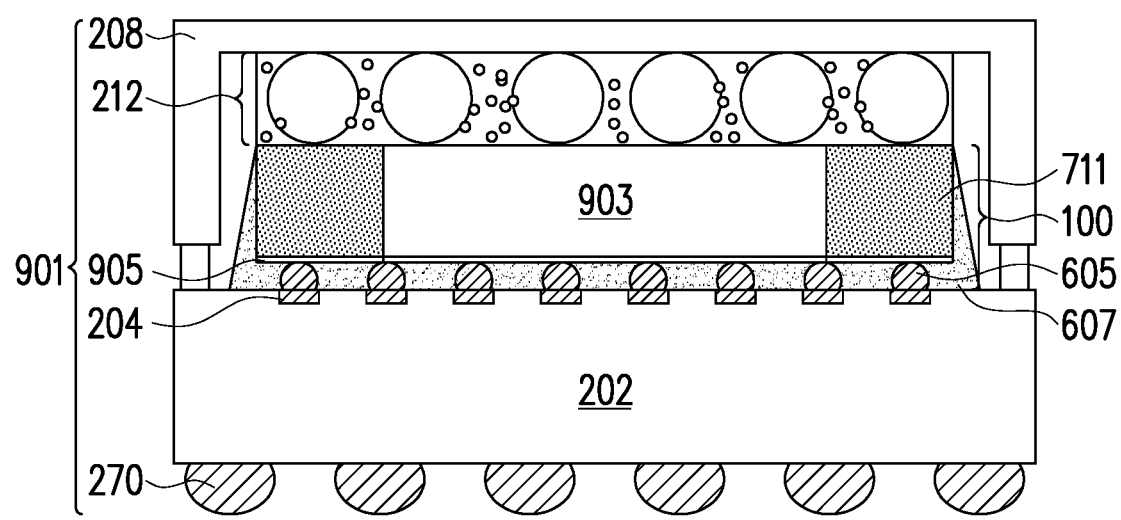

FIG. 9 illustrates a fifth 3D semiconductor package 901, in accordance with still another embodiment of the 3D semiconductor package. The fifth 3D semiconductor package 901 comprises a Fan-Out Wafer-Level-Package (FOWLP) device as the first device package 100 instead of the chip-on-wafer (CoW) package of the first 3D semiconductor package 501 of FIG. 5A. According to some embodiments, the FOWLP device comprises a semiconductor die 903 embedded in the molding compound 711 with external contact pads bonded to a redistribution layer (RDL) (e.g., RDL 905) comprising a series of metallization layers and serving as an integrated Fan-Out (InFO) for the first device package 100. The BGA 605 serves as external contacts of the first device package 100 (e.g., FOWLP device) and may be formed, for example, as pillars or as metal bumps, at external contact areas (e.g., under bump metallization (UBM) layers) (not shown) of the RDL 905 at a side opposite the semiconductor die 903. The first device package 100 is bonded via the BGA 605 to the front side bond pads 204 of the package substrate 202. According to some embodiments, the fifth 3D semiconductor package 901 comprises an underfill 607 filling the open spaces between the RDL 905 and the package substrate 202. The semiconductor die 903, the molding compound 711, the RDL 905, the BGA 605 may be formed via any suitable materials and any suitable methods for forming a FOWLP device. The fifth 3D semiconductor package 901 further comprises the TIM layer 212 and the heat dissipation element 208 placed over and attached to the semiconductor die 903 and the molding compound 711 via the TIM layer 212. The TIM layer 212 both physically and thermally couples the CoWoS package to the heat dissipation element 208. Furthermore, the fifth 3D semiconductor package 901 may be assembled using any suitable methods set forth above for assembling the first 3D semiconductor package 501.

Figure 10:
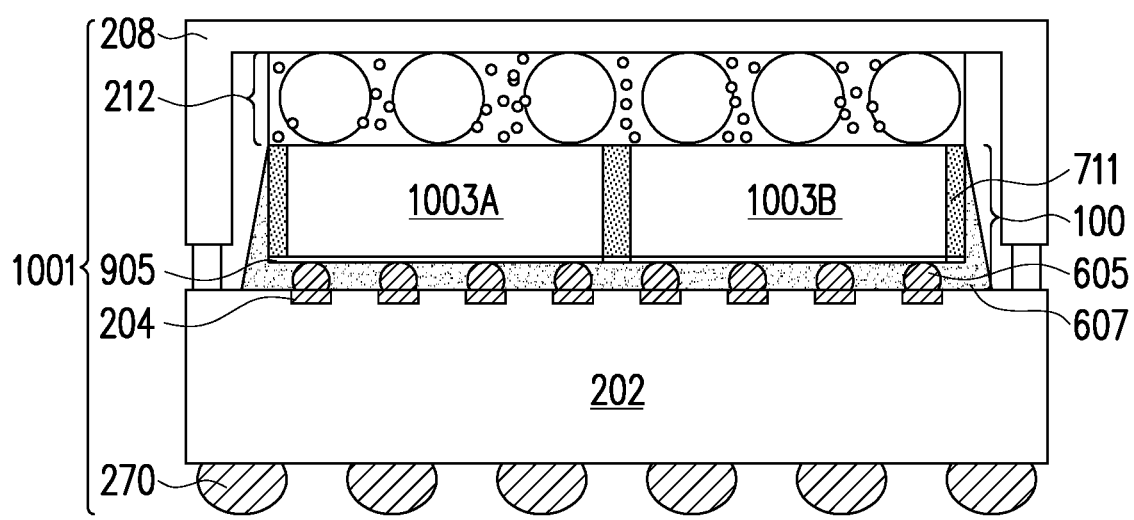

FIG. 10 illustrates a sixth 3D semiconductor package 1001, in accordance with another embodiment of the 3D semiconductor package. The sixth 3D semiconductor package 1001 comprises an integrated Fan-Out multi-die (InFO-multi die) package as the first device package 100 instead of the chip-on-wafer (CoW) package of the first 3D semiconductor package 501 of FIG. 5A. According to some embodiments, the InFO-multi die package comprises a first semiconductor die 1003A and a second semiconductor die 1003B embedded in the molding compound 711 with external contact pads of the first semiconductor die 1003A and external contact pads of the second semiconductor die 1003B being connected to the redistribution layer (RDL) (e.g., RDL 905) comprising a series of metallization layers and serving as an integrated Fan-Out (InFO) for the first device package 100. The BGA 605 serves as external contacts of the first device package 100 (e.g., InFO multi-die package) and may be formed, for example, as pillars or as metal bumps, at external contact areas (e.g., under bump metallization (UBM) layers) (not shown) of the RDL 905 at a side opposite the first semiconductor die 1003A and the second semiconductor die 1003B. The first device package 100 is bonded via the BGA 605 to the front side bond pads 204 of the package substrate 202. According to some embodiments, the sixth 3D semiconductor package 1001 comprises an underfill 607 filling the open spaces between the RDL 905 and the package substrate 202. The first semiconductor die 1003A, the second semiconductor die 1003B, the RDL 905, the molding compound 711, the BGA 605 and the underfill 607 may be formed via any suitable materials and any suitable methods for forming an InFO-multi die package. The sixth 3D semiconductor package 1001 further comprises the TIM layer 212 and the heat dissipation element 208 placed over and attached to the first semiconductor die 1003A, the second semiconductor die 1003B, and the molding compound 711 via the TIM layer 212. The TIM layer 212 both physically and thermally couples the InFO-multi die package to the heat dissipation element 208. Furthermore, the sixth 3D semiconductor package 1001 may be assembled using any suitable methods set forth above for assembling the first 3D semiconductor package 501.

Figure 11:
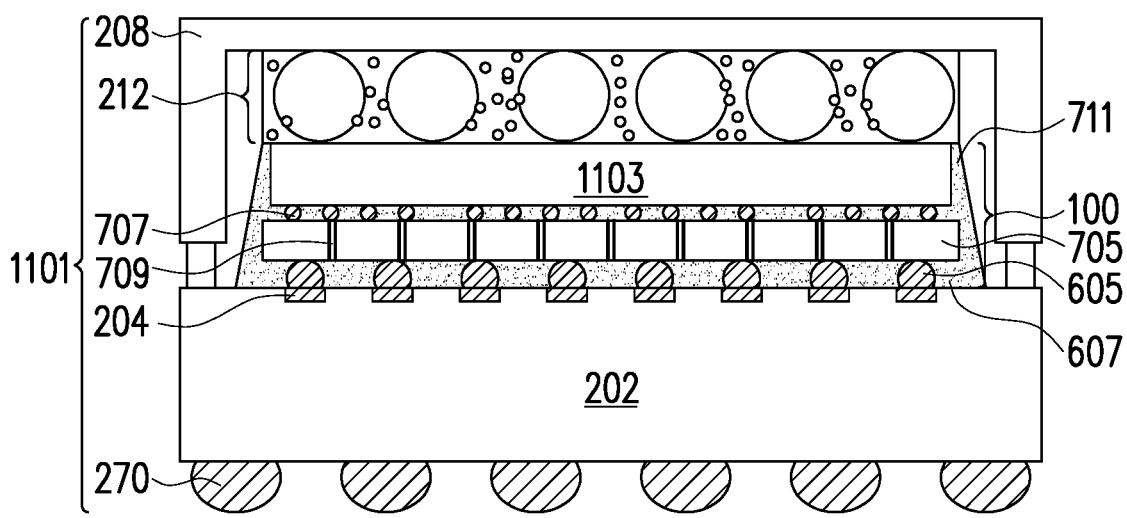

FIG. 11 illustrates a seventh 3D semiconductor package 1101, in accordance with yet another embodiment of the 3D semiconductor package. The seventh 3D semiconductor package 1101 comprises a 3D integrated circuit (3DIC) package as the first device package 100 instead of the chip-on-wafer (CoW) package of the first 3D semiconductor package 501 of FIG. 5A. According to some embodiments, the 3DIC package comprises an integrated circuit die 1103 attached to the silicon interposer 705. External contacts of the integrated circuit die 1103 are bonded through micro bumps 707 to external contacts of the top-side of the silicon interposer 705. The integrated circuit die 1103 and the silicon interposer 705 may be embedded in a molding compound 711 with through substrate vias (TSVs) 709 of the silicon interposer 705 electrically coupling the integrated circuit die 1103 to the BGA 605 formed at a bottom-side of the silicon interposer 705 as external contacts of the first device package 100 (e.g., 3DIC package). The first device package 100 is bonded via the BGA 605 to the front side bond pads 204 of the package substrate 202. According to some embodiments, the seventh 3D semiconductor package 1101 comprises an underfill 607 filling the open spaces between the silicon interposer 705 and the integrated circuit die 1103 and filling the open spaces between the silicon interposer 705 and the package substrate 202. The integrated circuit die 1103, the silicon interposer 705, the molding compound 711, the BGA 605 and the underfill 607 may be formed via any suitable materials and any suitable methods for forming a 3DIC package. The seventh 3D semiconductor package 1101 further comprises the TIM layer 212 and the heat dissipation element 208 placed over and attached to the integrated circuit die 1103 and the molding compound 711 via the TIM layer 212. The TIM layer 212 both physically and thermally couples the 3DIC package to the heat dissipation element 208. Furthermore, the seventh 3D semiconductor package 1101 may be assembled using any suitable methods set forth above for assembling the first 3D semiconductor package 501.

Figure 12:
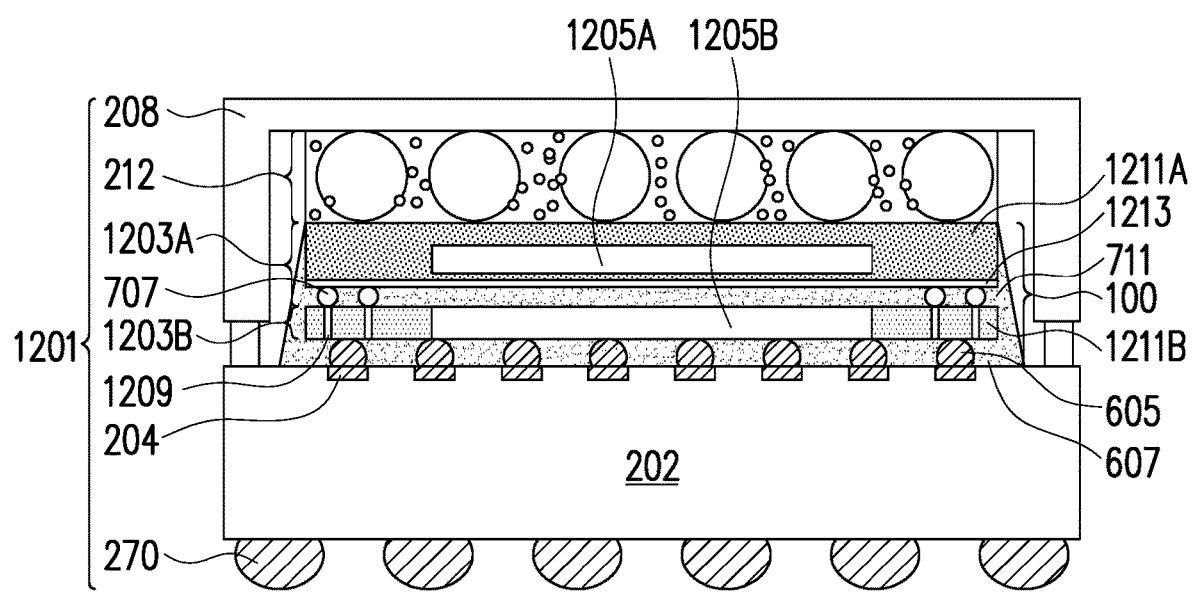

FIG. 12 illustrates an eighth 3D semiconductor package 1201, in accordance with still another embodiment of the 3D semiconductor package. The eighth 3D semiconductor package 1201 comprises a package on package (PoP) device as the first device package 100 instead of the chip-on-wafer (CoW) package of the first 3D semiconductor package 501 of FIG. 5A. According to some embodiments, the PoP device comprises a first package 1203A stacked over and attached to a second package 1203B. The first package 1203A comprises a first system-on-chip (SoC) (e.g., first SoC 1205A), an integrated Fan-Out (InFO) (e.g., InFO 1213) and a first encapsulant 1211A formed over the InFO 1213 and embedding the first SoC 1205A of the first package 1203A. Metal pads (not shown) of the first SoC 1205A are bonded to metallization layers (not shown) of the InFO 1213 electrically coupling the first SoC 1205A to external contact areas (e.g., UBMs) (not shown) of the InFO 1213. The second package 1203B comprises a second SoC 1205B, a second encapsulant 1211B, and a plurality of through InFO vias (TIVs) (e.g., TIVs 1209). The second SoC 1205B and TIVs 1209 are embedded within the second encapsulant 1211B and the TIVs 1209 extend through the second encapsulant 1211B from a top side of the second package 1203B to a bottom side of the second package 1203B. The micro bumps 707 serve as external contacts of the first package 1203A and are bonded between and electrically couple the external contact areas (not shown) of the InFO 1213 to the TIVs 1209 at the top side of the second package 1203B. The BGA 605 serves as external contacts of the first device package 100 (e.g., PoP device) with some solder bumps of the BGA 605 being bonded to the TIVs 1209 at the bottom side of the second package 1203B and other solder bumps of the BGA 605 being bonded to metal pads (not shown) of the second SoC 1205B. The first device package 100 is bonded via the BGA 605 to the front side bond pads 204 of the package substrate 202. According to some embodiments, the eighth 3D semiconductor package 1201 comprises the underfill 607 filling the open spaces between the second package 1203B and the first package 1203A and filling the open spaces between the second package 1203B and the package substrate 202. The first package 1203A, the second package 1203B, the molding compound 711, the BGA 605 and the underfill 607 may be formed via any suitable materials and any suitable methods for forming a PoP device. The eighth 3D semiconductor package 1201 further comprises the TIM layer 212 and the heat dissipation element 208 placed over and attached to a backside of the first package 1203A via the TIM layer 212. The TIM layer 212 both physically and thermally couples the PoP device to the heat dissipation element 208. Furthermore, the eighth 3D semiconductor package 1201 may be assembled using any suitable methods set forth above for assembling the first 3D semiconductor package 501.

According to some embodiments, a method includes: applying a thermal interface material over a semiconductor package, the thermal interface material comprising a core material and a thermally conductive fill material, the thermal interface material including first fill particles having a first distribution of sizes and second fill particles having a second distribution of sizes independent from the first distribution of sizes; and placing a heat dissipation element over the semiconductor package, the thermal interface material thermally coupling the heat dissipation element to the semiconductor package with first sides of the first fill particles physically contacting the semiconductor package and with second sides of the first fill particles physically contacting the heat dissipation element. In an embodiment, the placing the heat dissipation element forms to a uniform bond-line thickness between the semiconductor package and the heat dissipation element. In an embodiment, the uniform bond-line thickness is greater than 5 μm. In an embodiment, the first fill particles comprise silver (Ag). In an embodiment, an average size of the first distribution of sizes is at least two times greater than an average size of the second distribution of sizes. In an embodiment, a thermal conductivity of the first fill particles is at least 1 W/mk. In an embodiment, the thermally conductive fill material includes third fill particles having a third distribution of sizes independent from the first distribution of sizes and the second distribution of sizes.

According to some embodiments, a method including: electrically coupling a packaged semiconductor device to a package substrate; applying a thermal interface material over the packaged semiconductor device, the thermal interface material comprising a core material and a thermally conductive fill material, the thermally conductive fill material comprising at least a binary system of a first set of fill particles and a second set of fill particles, the first set of fill particles having a first average dimension and a second set of fill particles having a second average dimension being smaller than the first average dimension; and attaching a heat dissipation element to the packaged semiconductor device via the thermal interface material, the first set of fill particles uniformly spacing the heat dissipation element apart from the packaged semiconductor device by the first set of fill particles. In an embodiment, the method further includes curing the thermal interface material after the attaching the heat dissipation element. In an embodiment, the method further includes annealing the thermal interface material after the curing the thermal interface material. In an embodiment the packaged semiconductor device comprises a flip chip ball grid array device. In an embodiment the method further includes dispensing an adhesive layer over the package substrate; and attaching the heat dissipation element to the package substrate via the adhesive layer. In an embodiment the at least the binary system is at least a tertiary system with a third set of fill particles having a third average dimension being smaller than the second average dimension. In an embodiment the first set of fill particles comprises aluminum.

According to an embodiment, a semiconductor device includes: a packaged semiconductor device and electrically coupled to a package substrate; a heat dissipation element; and a thermal interface material disposed between and interfacing both the packaged semiconductor device and the heat dissipation element, the thermal interface material includes: a core material; and a thermally conductive fill material includes: primary fill particles, wherein the thermal interface material has a primary heat transfer path through a first primary fill particle, the primary heat transfer path extending from a first interface between the first primary fill particle and the packaged semiconductor device to a second interface between the first primary fill particle and the heat dissipation element; and secondary fill particles, wherein the thermal interface material has a secondary heat transfer path through the core material and at least one secondary fill particle, the at least one secondary fill particular being fully surrounded by the core material, the secondary heat transfer path extending from a first point along the packaged semiconductor device different from the first interface to a second point along heat dissipation element different from the second interface. In an embodiment the thermal interface material has a uniform bond-line thickness between the packaged semiconductor device and the heat dissipation element. In an embodiment the uniform bond-line thickness is at least 5 μm and a thermal conductivity of the primary fill particles is at least 1 W/mk. In an embodiment the thermally conductive fill material further comprises tertiary fill particles, the secondary heat transfer path extending through at least one tertiary fill particle. In an embodiment the packaged semiconductor device comprises a chip on wafer on substrate (CoWoS) device. In an embodiment the first primary fill particle comprises diamond.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
applying a thermal interface material over a semiconductor package, wherein the semiconductor package is embedded in an encapsulant, the thermal interface material comprising a core material and a thermally conductive fill material, the thermal interface material including first fill particles having a first distribution of sizes and second fill particles having a second distribution of sizes independent from the first distribution of sizes;
placing a heat dissipation element over the semiconductor package, the thermal interface material thermally coupling the heat dissipation element to the semiconductor package with first sides of the first fill particles physically contacting the encapsulant of the semiconductor package and with second sides of the first fill particles physically contacting the heat dissipation element, wherein one of the first fill particles has a thickness as large as a thickest portion of a remainder of the thermal interface material after the placing the heat dissipation element; and
annealing the thermal interface material, wherein the first fill particles are solid between the applying the thermal interface material and the annealing the thermal interface material.

2. The method of claim 1, wherein the placing the heat dissipation element forms to a uniform bond-line thickness between the semiconductor package and the heat dissipation element.

3. The method of claim 2, wherein the uniform bond-line thickness is greater than 5 µm.

4. The method of claim 3, wherein the first fill particles comprise silver (Ag).

5. The method of claim 3, wherein an average size of the first distribution of sizes is at least two times greater than an average size of the second distribution of sizes.

6. The method of claim 2, wherein a thermal conductivity of the first fill particles is at least 1 W/mk.

7. The method of claim 2, wherein the thermally conductive fill material includes third fill particles having a third distribution of sizes independent from the first distribution of sizes and the second distribution of sizes.

8. The method of claim 1, wherein a temperature of the first fill particle remains below a melting point of the first fill particle during the method.

9. A method, comprising:
electrically coupling a packaged semiconductor device to a package substrate, the packaged semiconductor device embedded in an encapsulant;
applying a thermal interface material over the packaged semiconductor device, the thermal interface material comprising a core material and a thermally conductive fill material, the thermally conductive fill material comprising at least a binary system of a first set of fill particles and a second set of fill particles, the first set of fill particles having a first average dimension and a second set of fill particles having a second average dimension being smaller than the first average dimension;
attaching a heat dissipation element to the packaged semiconductor device via the thermal interface material, the first set of fill particles uniformly spacing the heat dissipation element apart from the packaged semiconductor device by using at least one particle of the first set of fill particles as a spacer in physical contact with both the heat dissipation element and the packaged semiconductor device, and the at least one of the first set of fill particles in physical contact with both the heat dissipation element and the encapsulant; and
curing the thermal interface material after the attaching the heat dissipation element, wherein the first set of fill particles are solid at all times between the applying the thermal interface material and the curing the thermal interface material.

10. The method of claim 9, further comprising annealing the thermal interface material after the curing the thermal interface material.

11. The method of claim 9, wherein the packaged semiconductor device comprises a flip chip ball grid array device.

12. The method of claim 9, further comprising:
dispensing an adhesive layer over the package substrate; and
attaching the heat dissipation element to the package substrate.

13. The method of claim 9, wherein the at least the binary system is at least a tertiary system with a third set of fill particles having a third average dimension being smaller than the second average dimension.

14. The method of claim 9, wherein the first set of fill particles comprises aluminum.

15. A semiconductor device, comprising:
a packaged semiconductor device embedded in an encapsulant and electrically coupled to a package substrate;
a heat dissipation element; and
a thermal interface material disposed between and interfacing both the packaged semiconductor device and the heat dissipation element, the thermal interface material comprising:
a core material; and
a thermally conductive fill material comprising:
primary fill particles, wherein the thermal interface material has a primary heat transfer path through a first primary fill particle, the first primary fill particle extending from a first interface between the first primary fill particle and the packaged semiconductor device to a second interface between the first primary fill particle and the heat dissipation element, wherein the first primary fill particle has a fixed shape, wherein the thermal interface material has a second primary fill particle positioned above the encapsulant, the second primary fill particle extending from a third interface between the second primary fill particle and the encapsulant to a fourth interface between the second primary fill particle and the heat dissipation element; and
secondary fill particles, wherein the thermal interface material has a secondary heat transfer path through the core material and at least one secondary fill particle, the at least one secondary fill particles being fully surrounded by the core material, the secondary heat transfer path extending from a first point along the packaged semiconductor device different from the first interface to a second point along heat dissipation element different from the second interface.

16. The semiconductor device of claim 15, wherein the thermal interface material has a uniform bond-line thickness between the packaged semiconductor device and the heat dissipation element.

17. The semiconductor device of claim 16, wherein the uniform bond-line thickness is at least 5 μm and a thermal conductivity of the primary fill particles is at least 1 W/mk.

18. The semiconductor device of claim 15, wherein the thermally conductive fill material further comprises tertiary fill particles, the secondary heat transfer path extending through at least one tertiary fill particle.

19. The semiconductor device of claim 15, wherein the packaged semiconductor device comprises a chip on wafer on substrate (CoWoS) device.

20. The semiconductor device of claim 15, wherein the first primary fill particle comprises diamond.

* * * * *